(12) United States Patent
Thummalapally

(10) Patent No.: US 7,847,354 B1
(45) Date of Patent: Dec. 7, 2010

(54) SEMICONDUCTOR DEVICE WITH MULTIPLE TRANSISTORS FORMED IN A PARTIALLY DEPLETED SEMICONDUCTOR-ON-INSULATOR SUBSTRATE

(75) Inventor: Damodar R. Thummalapally, Milpitas, CA (US)

(73) Assignee: SuVolta, Inc., Los Gatos, CA (US)

( * ) Notice: Subject to any disclaimer, the term of this patent is extended or adjusted under 35 U.S.C. 154(b) by 143 days.

(21) Appl. No.: 12/366,791

(22) Filed: Feb. 6, 2009

(51) Int. Cl.
*H01L 27/01* (2006.01)
*H01L 21/00* (2006.01)

(52) U.S. Cl. ..................... 257/348; 438/149

(58) Field of Classification Search ......... 438/149–156, 438/479, 517; 257/347–352
See application file for complete search history.

(56) References Cited

U.S. PATENT DOCUMENTS 7,291,521 B2 * 11/2007 Orlowski et al. ............ 438/155
2008/0308816 A1   12/2008 Miller et al. .................. 257/76

2010/0171154 A1 * 7/2010 Saha .......................... 257/256

* cited by examiner

*Primary Examiner*—Calvin Lee
(74) *Attorney, Agent, or Firm*—Baker Botts L.L.P.

(57) ABSTRACT

A semiconductor device comprises a partially depleted semiconductor-on-insulator structure having both a three terminal JFET and a four terminal JFET constructed thereon. The four terminal JFET comprises a source region, a drain region, a channel region, a front gate region, and a back gate region formed in a semiconductor layer of the partially depleted semiconductor-on-insulator structure. The three terminal JFET comprises a source region formed in the semiconductor layer of the partially depleted semiconductor-on-insulator structure, and a drain region spaced apart from the source region and formed in the semiconductor layer of the partially depleted semiconductor-on-insulator structure. The three terminal JFET further comprises a channel region between the source region and the drain region and formed in the semiconductor layer of the partially depleted semiconductor-on-insulator structure. The three terminal JFET also comprises a gate region formed in the semiconductor layer of the partially depleted semiconductor-on-insulator structure. A gate-to-channel junction of the three terminal JFET is formed deep enough in the semiconductor layer such that the channel region of the three terminal JFET abuts an insulating layer of the semiconductor-on-insulator structure.

27 Claims, 2 Drawing Sheets

SEMICONDUCTOR DEVICE WITH MULTIPLE TRANSISTORS FORMED IN A PARTIALLY DEPLETED SEMICONDUCTOR-ON-INSULATOR SUBSTRATE

TECHNICAL FIELD OF THE INVENTION

The present disclosure relates generally to semiconductor devices and more particularly to a semiconductor device with multiple transistors formed in a partially depleted semiconductor-on-insulator substrate.

BACKGROUND OF THE INVENTION

As a result of the rapid technological growth of the past several decades, transistors and other semiconductor devices have become a fundamental building block for a wide range of electronic components. Metal-oxide silicon field-effect transistors (MOSFET) have been the primary choice for transistors in many applications including general-use microprocessors, digital signal processors, application specific integrated circuits (ASICs), and various other forms of electronic devices. With the demand for electronic devices that are increasingly smaller and faster, the inclusion of the metal oxide layer from which MOSFETs derive their name creates significant limitations to further improvements in the size and operating speed of such devices. Consequently, other types of semiconductor devices enabling complementary circuits, such as junction field effect transistors (JFETs), are being researched.

SUMMARY OF THE INVENTION

In accordance with the present invention, the disadvantages and problems associated with prior junction field effect transistors have been substantially reduced or eliminated.

In one embodiment, a semiconductor device comprises a partially depleted semiconductor-on-insulator structure having both a three terminal JFET and a four terminal JFET constructed thereon. The four terminal JFET comprises a source region, a drain region, a channel region, a front gate region, and a back gate region formed in a semiconductor layer of the partially depleted semiconductor-on-insulator structure. The three terminal JFET comprises a source region formed in the semiconductor layer of the partially depleted semiconductor-on-insulator structure, and a drain region spaced apart from the source region and formed in the semiconductor layer of the partially depleted semiconductor-on-insulator structure. The three terminal JFET further comprises a channel region between the source region and the drain region and formed in the semiconductor layer of the partially depleted semiconductor-on-insulator structure. The three terminal JFET also comprises a gate region formed in the semiconductor layer of the partially depleted semiconductor-on-insulator structure. A gate-to-channel junction of the three terminal JFET is formed deep enough in the semiconductor layer such that the channel region of the three terminal JFET abuts an insulating layer of the semiconductor-on-insulator structure.

In another embodiment, a semiconductor device comprises a partially depleted semiconductor-on-insulator structure having both a three terminal JFET and a four terminal JFET constructed thereon. The four terminal JFET comprises a source region, a drain region, a channel region, a front gate region, and a back gate region formed in a semiconductor layer of the partially depleted semiconductor-on-insulator structure. The three terminal JFET comprises a source region formed in the semiconductor layer of the partially depleted semiconductor-on-insulator structure, and a drain region spaced apart from the source region and formed in the semiconductor layer of the partially depleted semiconductor-on-insulator structure. The three terminal JFET further comprises a channel region between the source region and the drain region and formed in the semiconductor layer of the partially depleted semiconductor-on-insulator structure. The three terminal JFET further comprises a front gate region and a back gate region. The front gate region is formed at one surface of the semiconductor layer of the partially depleted semiconductor-on-insulator structure. The back gate region is formed at another surface of the semiconductor layer of the partially depleted semiconductor-on-insulator structure such that it abuts the insulating layer of the semiconductor-on-insulator structure, wherein the back gate region comprises a thickness that is small enough such that it does not hold a charge.

The following technical advantages may be achieved by some, none, or all of the embodiments of the present invention.

Semiconductor devices of the present disclosure provide novel designs for the transistors that are formed in partially depleted semiconductor-on-insulator structures so that these transistors can benefit from the structural and operational advantages of transistors built in fully depleted semiconductor-on-insulator structures without the expense and difficulty of using fully depleted semiconductor-on-insulator structures. For example, both three terminal and four terminal JFETs may be built in partially depleted semiconductor-on-insulator structures. These transistors may be operated independently of each other by applying separate bias voltages to the various terminals of these devices. However, by forming a three terminal JFET and a four terminal JFET on the same partially depleted semiconductor-on-insulator structure, one can design electronic circuits that benefit from using both types of transistors.

For example, an SRAM cell can benefit from having a small, more compact, three terminal JFET to perform certain operations, while also having a high performance four terminal JFET perform other operations. This allows the SRAM cell achieve a smaller footprint and higher circuit density while still achieving high performance where needed. Similarly, FPGA circuits can also benefit from using some smaller three terminal JFETs, and some high performance four terminal JFETs. By combining three and four terminal transistors on the same partially depleted semiconductor-on-insulator structures, the semiconductor devices of the present disclosure provide advantages to these and other electronic circuit applications. Prior CMOS based electronic circuits could not achieve such coexistence of three and four terminal devices on the same SOI structure because of the gate oxide that separates the gate terminal from the channel in CMOS transistors.

These and other advantages, features, and objects of the present invention will be more readily understood in view of the following description, drawings, and claims.

BRIEF DESCRIPTION OF THE DRAWINGS

For a more complete understanding of the present invention and its advantages, reference is now made to the following descriptions, taken in conjunction with the accompanying drawings, in which.

DETAILED DESCRIPTION OF THE INVENTION

Figure 1:
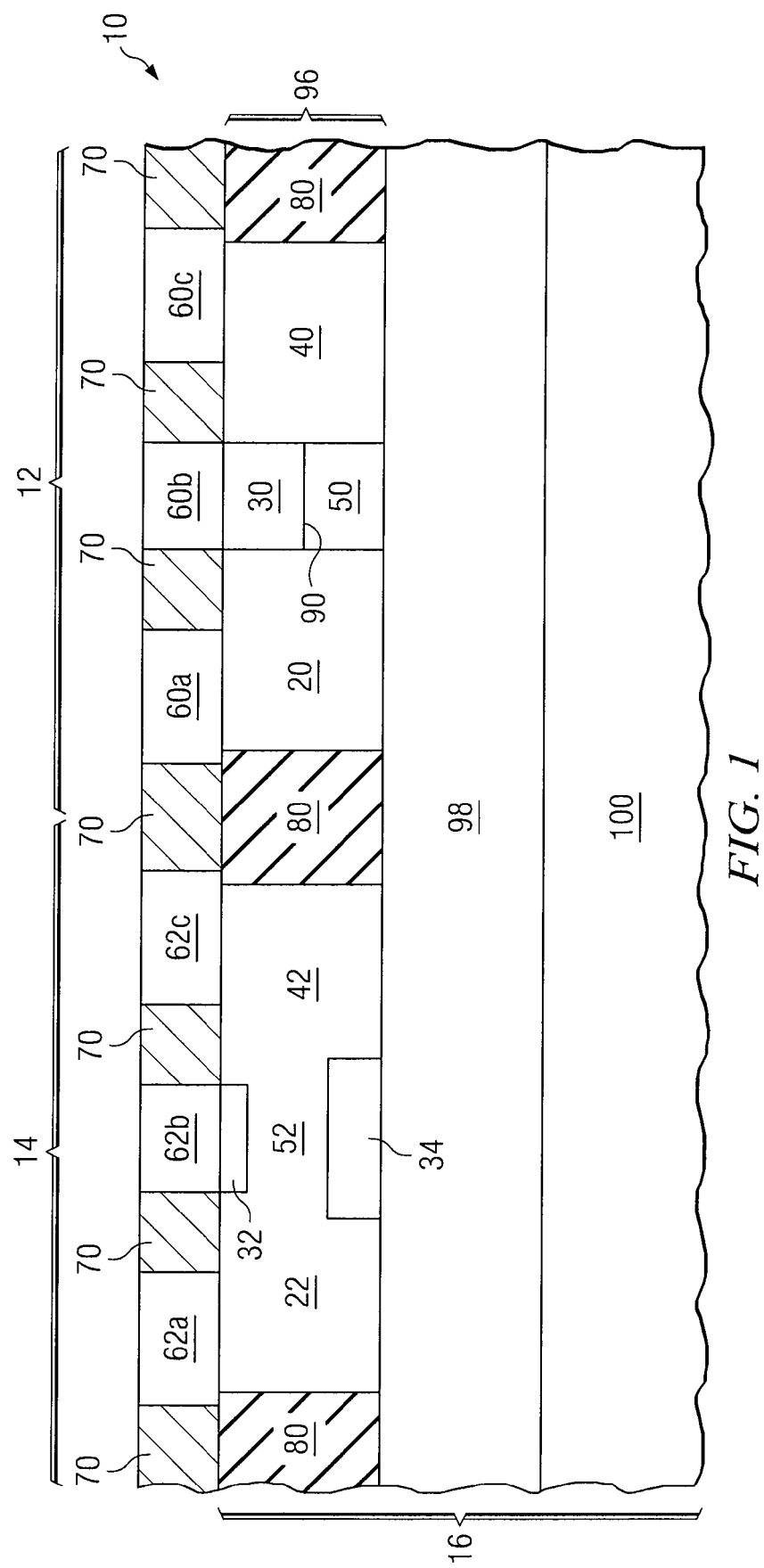
FIG. 1 illustrates one embodiment of a semiconductor device with a single gate transistor and a double gate transistor formed in a partially-depleted semiconductor-on-insulator substrate.

FIG. 1 illustrates one embodiment of a semiconductor device 10 comprising a single gate transistor 12 and a double gate transistor 14 formed in the same partially depleted semiconductor-on-insulator structure 16 (also referred to as PD-SOI structure 16). An SOI transistor differs from a bulk transistor in that its body (the internal substrate) isn't externally biased—unless a specific layout is used, such as in a body-contacted transistor. There are two types of SOI structures: fully depleted (FD-SOI structure) and partially depleted (PD-SOI structure). Both PD-SOI structures and FD-SOI structures may be used to form semiconductor devices, such as CMOS transistors and Junction Field Effect Transistors (JFETs). The terms partially and fully depleted refer to the channel region of a transistor. In both methods, the source and drain regions are depleted down to the insulating layer. Channel depth is where the two approaches differ. Partially depleted SOI channels aren't usually depleted down to the insulating layer, yet they are in fully depleted transistors. This is because an FD-SOI structure generally has a thinner layer of semiconductor formed on the insulating layer than a PD-SOI structure. As a result, an FD-SOI structure is generally more difficult and expensive to manufacture than a PD-SOI structure. Because of the depth of the channel regions discussed above, an FD-SOI structure is generally used to build three terminal transistors whereas a PD-SOI structure is generally used to build four terminal devices.

Figure 2:
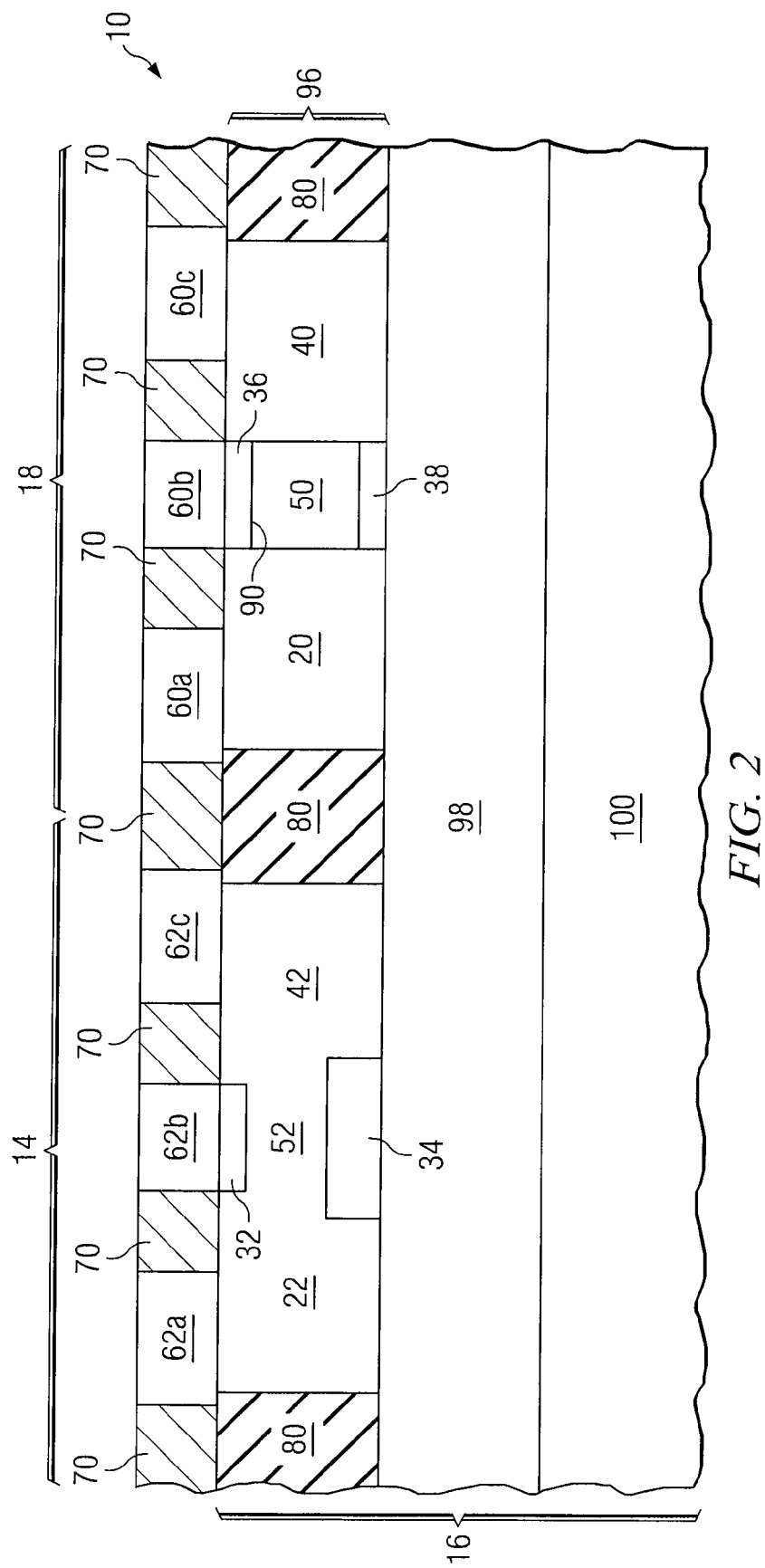
FIG. 2 illustrates one embodiment of a semiconductor device with multiple double gate transistors formed in a partially-depleted semiconductor-on-insulator substrate, wherein one of the transistors comprises a thin back gate region.

For completed devices to take full advantage of SOI's benefits, whether fully or partially depleted, circuit designers need to use specific techniques to help them address various challenges. In particular, they must pay attention to the behavior of the SOI material, which differs significantly from that of bulk material. Semiconductor device 10 provides novel designs for the transistors that are formed in PD-SOI structures so that these transistors can benefit from the structural and operational advantages of transistors built in FD-SOI structures without the expense and difficulty of using FD-SOI structures. One particular novel design, illustrated and designed with respect to FIG. 1, is the implementation of both a single gate transistor 12 and a double gate transistor 14 formed in the same PD-SOI structure 16, where transistor 12 is a three terminal device and double gate transistor 14 is a four terminal device. Another particular novel design, illustrated and designed with respect to FIG. 2, is the implementation of a double gate transistor 14 and a double gate transistor 18 formed in the same PD-SOI structure 16, where transistor 18 uses a thin back gate region so that it can operate as a three terminal device. Each of transistors 12, 14 and 18, and PD-SOI structure 16, is described in greater detail below.

Single gate transistor 12 comprises a source region 20, a gate region 30, a drain region 40, and a channel region 50 formed in PD-SOI structure 16. Transistor 12 further comprises contact regions 60a, 60b, and 60c which are separated from each other by an interlayer dielectric material (ILD) 70. Single gate transistor 12 is isolated from double gate transistor 14, and each of transistors 12 and 14 are isolated from other devices using shallow trench isolation 80. As transistor 12 only has one gate region, gate region 30, it is considered a three terminal device.

Double gate transistor 14 comprises a source region 22, a front gate region 32, a back gate region 34, a drain region 42, and a channel region 52 formed in the same PD-SOI structure 16 as single gate transistor 12. Transistor 14 further comprises contact regions 62a, 62b, and 62c which are separated from each other by ILD 70. As transistor 14 comprises both a front gate region 32 and a back gate region 34, it is considered a four terminal device (the contact region for back gate region 34 is not shown in FIG. 1).

The various regions of transistors 12 and 14 are not necessarily drawn to scale. In some embodiments, transistors 12 and 14 comprise JFETs. In one embodiment, transistors 12 and 14 may both comprise n-type channel transistors or both comprise p-type transistors. In another embodiment, transistor 12 may comprise an n-type transistor (or p-type transistor) and transistor 14 may comprise the opposite conductivity, such as a p-type transistor (or n-type transistor).

When appropriate voltages are applied to the terminals of transistor 12, a current flows through channel region 50 between source region 20 and drain region 40. Similarly, when appropriate voltages are applied to the terminals of transistor 14, a current flows through channel region 52 between source region 22 and drain region 42.

PD-SOI structure 16 comprises a semiconductor layer 96 on an insulating layer 98 formed in substrate 100. Although semiconductor device 10 is described as having a semiconductor layer 96 that comprises silicon, it should be understood that semiconductor layer 96 may also be formed using other materials and/or alloys, such as silicon-germanium. Semiconductor layer 96 has a thickness that ranges from approximately 50-70 nm. In contrast, a typical FD-SOI structure comprises a semiconductor layer having a thickness that ranges from approximately 10-20 nm. Forming such a thin semiconductor layer can be difficult and costly. This is one reason why a PD-SOI structure may be used in semiconductor device 10. However, due to the thicker semiconductor layer used, PD-SOI structures generally are used to form transistors with front and back gate regions. In some applications, such as in some digital circuit applications, the back gate region can be left floating with respect to ground. However, in other applications, such as in most analog circuit applications, the back gate region should be biased by the application of a voltage to a separate external terminal. Thus, PD-SOI structures are generally used to form four terminal devices. As will be described in greater detail below, semiconductor device 10 can advantageously include both three and four terminal devices in the same PD-SOI structure. Moreover, the three terminal device need not have a floating back gate region.

Insulating layer 98 may comprise silicon dioxide, sapphire, or any other suitable insulating material. The remainder of this disclosure will be described with reference to an embodiment of semiconductor device 10 in which silicon dioxide is used as the insulating layer 98. In these embodiments, insulating layer 98 may be referred to as a buried oxide layer. Insulating layer 98 may be formed to have any suitable depth using any suitable fabrication techniques commonly known to those of skill in the art. In one embodiment, insulating layer 98 has a depth ranging from 100 to 150 nm. Insulating layer 98 generally isolates the active regions of device 10 from substrate 100. This lowers the parasitic capacitance of device 10, which improves power consumption at matched performance.

Substrate 100 represents bulk semiconductor material on which insulating layer 98 can be formed. Substrate 100 may be formed of any suitable semiconductor material, such as materials from Group IV, or a compound semiconductor from Group III and Group V of the periodic table. In particular embodiments, substrate 100 is formed of single-crystal silicon. In other embodiments, substrate 100 is an alloy of silicon and at least one other material. For example, substrate 100 may be formed of silicon-germanium. In yet other embodiments, substrate 100 is formed of single-crystal germanium. Substrate 100 may have a particular conductivity type, such as p-type or n-type. In particular embodiments, semiconductor device 10 may represent a portion of substrate 100 that is shared by a plurality of different semiconductor devices (not illustrated in FIG. 1).

Referring now to single gate transistor 12, channel region 50 provides a path to conduct current between source region 20 and drain region 40. Channel region 50 is formed by the addition of dopants to semiconductor layer 96 formed on insulating layer 98. For example, the dopants may represent particles of n-type doping material such as antimony, arsenic, phosphorous, or any other appropriate n-type dopant. Alternatively, the dopants may represent particles of p-type doping material such as boron, gallium, indium, or any other suitable p-type dopant. Where the channel region 50 is doped with n-type impurities, conduction between drain 40 and source 20 is dominated by electrons when appropriate voltage is applied to the gate and drain terminals of transistor 12 with respect to the source. Where channel region 50 is doped with p-type impurities, conduction between drain 40 and source 20 is dominated by holes when appropriate voltage is applied to gate and drain terminals of transistor 12 with respect to the source.

Source region 20 and drain region 40 each comprise regions formed by the addition of dopants to the semiconductor layer 96 formed on insulating layer 98. Thus, for an n-channel transistor 12, source region 20 and drain region 40 are doped with n-type impurities. For a p-channel transistor 12, source region 20 and drain region 40 are doped with p-type impurities. In particular embodiments, source region 20 and drain region 40 have a doping concentration at or higher than 1E+19 atoms/cm$^3$. In one embodiment, source region 20 and drain region 40 each have a depth of between 50 and 70 nm.

Gate region 30 has a conductivity type opposite the conductivity type of channel region 50. Thus, for an n-channel transistor 50, gate region 30 is doped with p-type impurities. For a p-channel transistor 50, gate region 30 is doped with n-type impurities. In particular embodiments, gate region 30 is doped with the second type of dopant to a concentration at or higher than 1E+19 atoms/cm$^3$. As described further below, when a voltage is applied to gate region 30, the applied voltage alters the conductivity of the neighboring channel region 50, thereby facilitating or impeding the flow of current between source region 20 and drain region 40.

The interface between gate region 30 and channel region 50 forms a junction 90, also referred to as a gate-to-channel junction 90. In one embodiment, junction 90 is driven deeply into semiconductor layer 96 by varying the implant dose and/or energy for channel region 50. The junction 90 can also be adjusted by varying the implant does and/or energy for gate region 30. In one embodiment, the implant dose for channel region 50 comprises 1E+14 atoms/cm$^2$ at an implant energy of 10 KeV. In this regard, the doping profile of the impurities implanted in channel region 50 can be adjusted such that the junction 90 is driven deeply into semiconductor layer 96. As a result, channel region 50 abuts insulating layer 98 such that transistor 12 can eliminate a back gate region. In this regard, transistor 12 is a single gate device. By eliminating a back gate region, transistor 12 does not need to allocate any portion of its area dimensions, also referred to as footprint, to an external back gate terminal. Thus, single gate transistor 12 can be made smaller than typical double gate transistors.

In one embodiment, the gate-to-channel junction 90 is driven into the semiconductor layer 96 such that gate region 30 has a thickness of approximately 20-30 nm and channel region 50 has a thickness of 20-50 nm. For example, in a particular embodiment where semiconductor layer 96 is 50 nm thick, the gate region 30 may be 20 nm thick and the channel region 50 may be 30 nm thick. In another particular embodiment where semiconductor layer 96 is 70 nm thick, the gate region 30 may be 30 nm thick and channel region 50 may be 40 nm thick. Transistor 12 may have any other suitable number of combinations of thickness for semiconductor layer 96, gate region 30, and channel region 50.

The doping concentration for channel region 50 may be modified to optimize the $I_{on}$ and $I_{off}$ characteristics of transistor 12. For example, a heavily doped channel region 50 may yield a higher $I_{on}$, but also have a higher $I_{off}$. Conversely, a lightly doped channel region 50 may result in a lower $I_{off}$, but also have a lower $I_{on}$. Thus, the doping concentration may be adjusted based at least in part upon the particular need for increased drive current, $I_{on}$, or the need for decreased leakage current, $T_{off}$, in any given electronic circuit application. In one embodiment, the doping concentration for channel region 50 ranges from 1E+17 atoms/cm$^3$ to 1E+19 atoms/cm$^3$. Moreover, the doping concentration for channel region 50 may be maintained such that transistor 12 operates in an enhancement mode, with a current flowing between drain region 40 and source region 20 when a positive voltage differential is applied between gate region 30 and source region 20.

The length of channel region 50 also has an influence upon the $I_{on}$ and $I_{off}$ characteristics of transistor 12. For example, the longer the channel region 50, the lower the drive current, $I_{on}$, and the lower the leakage current, $I_{off}$, will be. Conversely, the shorter the channel region 50, the higher the $I_{on}$ and $I_{off}$ will be. In one embodiment, the deeper the junction 90 is driven into semiconductor layer 96, the longer the channel region 50 will be. Thus, the length of channel region 50 may also be adjusted based at least in part upon the particular need for increased drive current, $I_{on}$, or the need for decreased leakage current, $I_{off}$, in any given electronic circuit application.

Connection regions 60a, 60b, and 60c comprise structures that provide an ohmic connection to source region 20, gate region 30, and drain region 40, respectively. In particular embodiments, connection regions 60a, 60b, and 60c may be coplanar. Coplanar connection regions 60a, 60b, and 60c may simplify the manufacturing and packaging of semiconductor device 10. Connection regions 60a, 60b, and 60c may be formed of polysilicon or any suitable metal such as, for example, aluminum or copper. Interlayer dielectric material 70 comprises dielectric material used to electrically separate closely spaced interconnect lines arranged in several levels (multilevel metallization) in an integrated circuit. ILD material 70 generally has a low dielectric constant, k, to minimize capacitive coupling between adjacent metal lines. In one embodiment, ILD 70 comprises oxide.

In operation of transistor 12, channel region 50 provides a voltage-controlled conductivity path between source region 20 and drain region 40. More specifically, a voltage differential between gate region 30 and source region 20 (referred to herein as $V_{GS}$) controls channel region 50 by increasing or decreasing a width of a depletion region formed within channel region 50. The depletion region defines an area within channel region 50 in which holes and electrons have depleted semiconductor device 10. Because the depletion region lacks charge carriers, it will impede the flow of current between source region 20 and drain region 40 by forming an energy barrier. Moreover, as the depletion region expands or recedes, the portion of channel region 50 through which current can flow grows or shrinks, respectively. As a result, the conductivity of channel region 50 increases and decreases as $V_{GS}$ changes, and semiconductor device 10 may operate as a voltage-controlled current regulator.

Transistor 12 can comprise either a depletion mode device or an enhancement mode device. One difference between enhancement mode devices and depletion mode devices is the threshold voltage (Vth) of the device. For example, for an enhancement mode n-channel device, the Vth>0.1V, whereas for a depletion mode n-channel device, the Vth<−0.1V. The depletion region pinches off channel region 50 when Vgs<Vth. Thus, at Vgs=0, the enhancement mode device is turned off, but the depletion mode device remains on.

Referring now to transistor 14, channel region 52 provides a path to conduct current between source region 22 and drain region 42. Channel region 52 is formed by the addition of dopants to semiconductor layer 96 formed on insulating layer 98. For example, the dopants may represent particles of n-type doping material such as antimony, arsenic, phosphorous, or any other appropriate n-type dopant. Alternatively, the dopants may represent particles of p-type doping material such as boron, gallium, indium, or any other suitable p-type dopant. Where the channel region 52 is doped with n-type impurities, conduction between drain 42 and source 22 is dominated by electrons when appropriate voltage is applied to the gate and drain terminals of transistor 14 with respect to the source. Where channel region 52 is doped with p-type impurities, conduction between drain 42 and source 22 is dominated by holes when appropriate voltage is applied to gate and drain terminals of transistor 14 with respect to the source.

Source region 22 and drain region 42 each comprise regions formed by the addition of dopants to the semiconductor layer 96 formed on insulating layer 98. Thus, for an n-channel transistor 14, source region 22 and drain region 42 are doped with n-type impurities. For a p-channel transistor 14, source region 22 and drain region 42 are doped with p-type impurities. In particular embodiments, source region 22 and drain region 42 have a doping concentration at or higher than 1E+19 atoms/cm$^3$. In one embodiment, source region 22 and drain region 42 each have a depth of between 50 and 70 nm.

Front gate region 32 and back gate region 34 each have a conductivity type opposite the conductivity type of channel region 52. Thus, for an n-channel transistor 14, gate regions 32 and 34 are doped with p-type impurities. For a p-channel transistor 14, gate regions 32 and 34 are doped with n-type impurities. In particular embodiments, gate regions 32 and 34 are doped with the second type of dopant to a concentration at or higher than 1E+19 atoms/cm$^3$ and 1E+18 atoms/cm$^3$, respectively. As described further below, when a voltage is applied to gate regions 32 and 34, the applied voltage alters the conductivity of the neighboring channel region 52, thereby facilitating or impeding the flow of current between source region 22 and drain region 42.

Connection regions 62a, 62b, and 62c comprise structures that provide an ohmic connection to source region 22, front gate region 32, and drain region 42, respectively. A fourth connection region (not shown) can be used to connect to back gate region 34. In particular embodiments, connection regions 62a, 62b, and 62c may be coplanar. Coplanar connection regions 62a, 62b, and 62c may simplify the manufacturing and packaging of semiconductor device 10. Connection regions 62a, 62b, and 62c may be formed of any suitable metal such as, for example, aluminum or copper. Connection regions 62a-c are separated from each other using ILD 70.

In operation of transistor 14, channel region 52 provides a voltage-controlled conductivity path between source region 22 and drain region 42. More specifically, a voltage differential between gate regions 32 and 34 and source region 22 (referred to herein as $V_{GS}$) controls channel region 52 by increasing or decreasing a width of a depletion region formed within channel region 52. The depletion region defines an area within channel region 52 in which holes and electrons have depleted semiconductor device 10. Because the depletion region lacks charge carriers, it will impede the flow of current between source region 22 and drain region 42 by forming an energy barrier. Moreover, as the depletion region expands or recedes, the portion of channel region 52 through which current can flow grows or shrinks, respectively. As a result, the conductivity of channel region 52 increases and decreases as $V_{GS}$ changes, and semiconductor device 10 may operate as a voltage-controlled current regulator. As transistor 14 has both a front gate region 32 and a back gate region 34, the depletion region can be formed on both the top and bottom of channel region 52. In this regard, transistor 14 may be able to provide reliable control of the current flowing through channel region 52.

Transistor 14 can comprise either a depletion mode device or an enhancement mode device. One difference between enhancement mode devices and depletion mode devices is the threshold voltage (Vth) of the device. For example, for an enhancement mode n-channel device, the Vth>0.1V, whereas for a depletion mode n-channel device, the Vth<−0.1V. The depletion region pinches off channel region 50 when Vgs<Vth. Thus, at Vgs=0, the enhancement mode device is turned off, but the depletion mode device remains on.

Transistors 12 and 14 can be operated independently of each other by applying separate bias voltages to the various terminals of these devices. However, by forming a three terminal device, such as transistor 12, and a four terminal device, such as transistor 14, on the same PD-SOI structure 16, one can design electronic circuits that benefit from using both types of transistors. For example, an SRAM cell can benefit from having a small, more compact, three terminal device, such as transistor 12, to perform certain operations, while also having a high performance four terminal device perform other operations. This allows the SRAM cell achieve a smaller footprint and higher circuit density while still achieving high performance where needed. Similarly, FPGA circuits can also benefit from using some smaller three terminal devices, such as transistor 12, and some high performance four terminal devices, such as transistor 14. By combining transistors 12 and 14 on the same PD-SOI structure 16, semiconductor device 10 provides advantages to these and other electronic circuit applications. Prior CMOS based electronic circuits could not achieve such coexistence of three and four terminal devices on the same SOI structure because of the gate oxide that separates the gate terminal from the channel in CMOS transistors.

FIG. 2 illustrates another embodiment of a semiconductor device 10 comprising a double gate transistor 18 and double gate transistor 14 formed in the same PD-SOI structure 16.

Double gate transistor 18 is similar to single gate transistor 12 in that it is also a three terminal device. In particular, double gate transistor 18 comprises the same active regions (e.g., source region 20, drain region 40, channel region 50) and connection regions (e.g., connections regions 60a-c) as single gate transistor 12. However, rather than having single gate region 30, transistor 18 has a front gate region 36 and a thin back gate region 38. Thin back gate region 38 has a thickness of approximately 5-10 nm. Thus, back gate region 38 of transistor 18 is too thin to hold any charge carriers. Thus, it comprises a fully depleted back gate region. As a result, thin back gate region 38 does not need to be connected to an external terminal. However, by using thin back gate region 38, transistor 18 can allow the gate-channel junction 90 to be closer to the surface of semiconductor layer 96 than junction 90 is in transistor 12, while at the same time maintaining (or reducing) the thickness of channel region 50. Another advantage of thing back gate region 38 is that it can shield channel region 50 from interface charges, if any, at the interface between semiconductor layer 96 and insulating layer 98.

In a particular embodiment where semiconductor layer 96 is 50 nm thick, the front gate region 36 may be 20 nm thick, the back gate region 38 may be 10 nm thick, and the channel region 50 may be 20 nm thick. Transistor 18 may have any other suitable number of combinations of thickness for semiconductor layer 96, front gate region 36, back gate region 38, and channel region 50 such that back gate region 38 is too thin to hold a charge. Thus, a semiconductor device 10 having transistors 14 and 18 is a viable alternative to a semiconductor device 10 having transistors 12 and 14.

Although the present invention has been described in detail, it should be understood that various changes, substitutions and alterations can be made hereto without departing from the scope of the invention as defined by the appended claims.

What is claimed is:

1. A semiconductor device, comprising:
a partially depleted semiconductor-on-insulator structure having a three terminal JFET constructed thereon;
wherein the three terminal JFET comprises:
a source region formed in a semiconductor layer of the partially depleted semiconductor-on-insulator structure;
a drain region spaced apart from the source region and formed in the semiconductor layer of the partially depleted semiconductor-on-insulator structure;
a channel region between the source region and the drain region and formed in the semiconductor layer of the partially depleted semiconductor-on-insulator structure; and
a gate region formed in the semiconductor layer of the partially depleted semiconductor-on-insulator structure, wherein a gate-to-channel junction is formed deep enough in the semiconductor layer such that the channel region abuts an insulating layer of the semiconductor-on-insulator structure.

2. The semiconductor device of claim 1, wherein:
the semiconductor layer of the partially depleted semiconductor-on-insulator structure comprises a thickness ranging from 50-70 nm;
the gate region comprises a thickness ranging from 20-30 nm; and
the channel region comprises a thickness of 20-40 nm.

3. The semiconductor device of claim 1, wherein the location of the gate-to-channel junction within the semiconductor layer is based at least in part upon an implant dose and energy of dopants for the channel region.

4. The semiconductor device of claim 1, wherein the semiconductor layer comprises one of silicon or silicon-germanium.

5. A semiconductor device, comprising:
a partially depleted semiconductor-on-insulator structure having both a three terminal JFET and a four terminal JFET constructed thereon;
wherein the four terminal JFET comprises a source region, a drain region, a channel region, a front gate region, and a back gate region formed in a semiconductor layer of the partially depleted semiconductor-on-insulator structure; and
wherein the three terminal JFET comprises:
a source region formed in the semiconductor layer of the partially depleted semiconductor-on-insulator structure;
a drain region spaced apart from the source region and formed in the semiconductor layer of the partially depleted semiconductor-on-insulator structure;
a channel region between the source region and the drain region and formed in the semiconductor layer of the partially depleted semiconductor-on-insulator structure; and
a gate region formed in the semiconductor layer of the partially depleted semiconductor-on-insulator structure, wherein a gate-to-channel junction of the three terminal JFET is formed deep enough in the semiconductor layer such that the channel region of the three terminal JFET abuts an insulating layer of the semiconductor-on-insulator structure.

6. The semiconductor device of claim 5, wherein:
the semiconductor layer of the partially depleted semiconductor-on-insulator structure comprises a thickness ranging from 50-70 nm;
the gate region of the three terminal JFET comprises a thickness ranging from 20-30 nm; and
the channel region of the three terminal JFET comprises a thickness of 20-40 nm.

7. The semiconductor device of claim 5, wherein the location of the gate-to-channel junction within the semiconductor layer is based at least in part upon an implant dose and energy of dopants for the channel region of the three terminal JFET.

8. The semiconductor device of claim 5, wherein the three terminal JFET and the four terminal JFET are used in the same SRAM cell.

9. The semiconductor device of claim 5, wherein the three terminal JFET and the four terminal JFET are used in the same FPGA device.

10. The semiconductor device of claim 5, wherein the semiconductor layer comprises one of silicon or silicon-germanium.

11. The semiconductor device of claim 5, wherein the four terminal JFET comprises an n-channel transistor and the three terminal JFET comprises a p-channel transistor.

12. The semiconductor device of claim 5, wherein the four terminal JFET comprises a p-channel transistor and the three terminal JFET comprises an n-channel transistor.

13. The semiconductor device of claim 5, wherein the four terminal JFET comprises an n-channel transistor and the three terminal JFET comprises an n-channel transistor.

14. The semiconductor device of claim 5, wherein the four terminal JFET comprises a p-channel transistor and the three terminal JFET comprises a p-channel transistor.

15. A semiconductor device, comprising:
a partially depleted semiconductor-on-insulator structure having both a three terminal JFET and a four terminal JFET constructed thereon;

wherein the four terminal JFET comprises a source region, a drain region, a channel region, a front gate region, and a back gate region formed in a semiconductor layer of the partially depleted semiconductor-on-insulator structure; and wherein the three terminal JFET comprises:
- a source region formed in the semiconductor layer of the partially depleted semiconductor-on-insulator structure;
- a drain region spaced apart from the source region and formed in the semiconductor layer of the partially depleted semiconductor-on-insulator structure;
- a channel region between the source region and the drain region and formed in the semiconductor layer of the partially depleted semiconductor-on-insulator structure;
- a front gate region formed at one surface of the semiconductor layer of the partially depleted semiconductor-on-insulator structure; and
- a back gate region formed at another surface of the semiconductor layer of the partially depleted semiconductor-on-insulator structure such that it abuts an insulating layer of the semiconductor-on-insulator structure, wherein the back gate region comprises a thickness that is small enough such that it does not hold a charge.

16. The semiconductor device of claim 15, wherein:
the semiconductor layer of the partially depleted semiconductor-on-insulator structure comprises a thickness ranging from 50-70 nm;
the front gate region comprises a thickness ranging from 20-30 nm; and
the channel region comprises a thickness of 20-40 nm.

17. The semiconductor device of claim 15, wherein the thickness of the back gate region comprises 10 nm or less.

18. The semiconductor device of claim 15, wherein the location of the gate-to-channel junction within the semiconductor layer is based at least in part upon an implant dose and energy of dopants for the channel region.

19. The semiconductor device of claim 15, wherein the back gate region is not tied to an external terminal.

20. The semiconductor device of claim 15, wherein the three terminal JFET and the four terminal JFET are used in the same SRAM cell.

21. The semiconductor device of claim 15, wherein the three terminal JFET and the four terminal JFET are used in the same FPGA device.

22. The semiconductor device of claim 15, wherein the semiconductor layer comprises one of silicon or silicon-germanium.

23. The semiconductor device of claim 15, wherein the four terminal JFET comprises an n-channel transistor and the three terminal JFET comprises a p-channel transistor.

24. The semiconductor device of claim 15, wherein the four terminal JFET comprises a p-channel transistor and the three terminal JFET comprises an n-channel transistor.

25. The semiconductor device of claim 15, wherein the four terminal JFET comprises an n-channel transistor and the three terminal JFET comprises an n-channel transistor.

26. The semiconductor device of claim 15, wherein the four terminal JFET comprises a p-channel transistor and the three terminal JFET comprises a p-channel transistor.

27. The semiconductor device of claim 15, wherein the back gate region shields the channel region from charges that may accumulate at the interface between the semiconductor layer and the insulating layer.

* * * * *